US008313958B2

(12) United States Patent  
Swaminathan et al.

(10) Patent No.: US 8,313,958 B2  
(45) Date of Patent: Nov. 20, 2012

(54) MAGNETIC MICROELECTRONIC DEVICE ATTACHMENT

(75) Inventors: Rajasekaran Swaminathan, Chandler, AZ (US); Ravindranath Mahajan, Chandler, AZ (US); John S. Guzek, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 30 days.

(21) Appl. No.: 12/778,335

(22) Filed: May 12, 2010

(65) Prior Publication Data

US 2011/0281375 A1 Nov. 17, 2011

(51) Int. Cl.
*H01L 21/50* (2006.01)

(52) U.S. Cl. .................. 438/3; 257/E21.499

(58) Field of Classification Search .......... 438/3; 257/E21.499
See application file for complete search history.

(56) References Cited

U.S. PATENT DOCUMENTS

| | | | |
|---|---|---|---|
| 3,839,727 A | 10/1974 | Herdzik et al. | |
| 4,983,804 A | 1/1991 | Chan et al. | |
| 5,048,744 A | 9/1991 | Chang et al. | |
| 5,093,545 A | 3/1992 | McGaffigan | |
| 5,346,775 A * | 9/1994 | Jin et al. | 428/614 |
| 5,353,498 A | 10/1994 | Fillion et al. | |
| 5,497,033 A | 3/1996 | Fillion et al. | |
| 5,527,741 A | 6/1996 | Cole et al. | |
| 5,838,069 A | 11/1998 | Itai et al. | |
| 5,841,193 A | 11/1998 | Eichelberger | |
| 5,846,366 A * | 12/1998 | Jin et al. | 156/233 |
| 5,907,786 A | 5/1999 | Shinomiya | |
| 6,154,366 A | 11/2000 | Ma et al. | |
| 6,159,767 A | 12/2000 | Eichelberger | |
| 6,174,797 B1 | 1/2001 | Bao et al. | |
| 6,239,482 B1 | 5/2001 | Fillion et al. | |
| 6,242,282 B1 | 6/2001 | Fillion et al. | |
| 6,271,469 B1 | 8/2001 | Ma et al. | |
| 6,306,680 B1 | 10/2001 | Fillion et al. | |
| 6,396,148 B1 | 5/2002 | Eichelberger et al. | |
| 6,396,153 B2 | 5/2002 | Fillion et al. | |
| 6,423,570 B1 | 7/2002 | Ma et al. | |
| 6,426,545 B1 | 7/2002 | Eichelberger et al. | |
| 6,454,159 B1 | 9/2002 | Takushima | |
| 6,489,185 B1 | 12/2002 | Towle et al. | |
| 6,555,906 B2 | 4/2003 | Towle et al. | |
| 6,555,908 B1 | 4/2003 | Eichelberger et al. | |
| 6,580,611 B1 | 6/2003 | Vandentop et al. | |
| 6,586,276 B2 | 7/2003 | Towle et al. | |
| 6,586,822 B1 | 7/2003 | Vu et al. | |
| 6,586,836 B1 | 7/2003 | Ma et al. | |

(Continued)

OTHER PUBLICATIONS

Habib, et al., "Novel Solder-Magnetic Particle Composites and Their Reflow Using AC Magnetic Fields", IEEE Transactions on Magnetics, vol. 46, No. 6, Jun. 2010, pp. 1-4.

(Continued)

*Primary Examiner* — Alexander Ghyka  
*Assistant Examiner* — Stanetta Isaac  
(74) *Attorney, Agent, or Firm* — Winkle, PLLC

(57) ABSTRACT

The present disclosure relates to the field of fabricating microelectronic packages, wherein microelectronic devices of the microelectronic packages may have magnetic attachment structures comprising a magnetic material formed on an attachment structure. The microelectronic device may be aligned on a substrate with a magnetic field and then held in place therewith while being attached to the substrate. The microelectronic device may also be aligned with an alignment plate which magnetically aligns and holds the component in place while being packaged.

23 Claims, 15 Drawing Sheets

U.S. PATENT DOCUMENTS

| | | |
|---|---|---|
| 6,617,682 B1 | 9/2003 | Ma et al. |
| 6,642,485 B2 | 11/2003 | Goenka et al. |
| 6,703,400 B2 | 3/2004 | Johnson et al. |
| 6,706,553 B2 | 3/2004 | Towle et al. |
| 6,709,898 B1 | 3/2004 | Ma et al. |
| 6,713,859 B1 | 3/2004 | Ma |
| 6,734,534 B1 | 5/2004 | Vu et al. |
| 6,794,223 B2 | 9/2004 | Ma et al. |
| 6,818,544 B2 | 11/2004 | Eichelberger et al. |
| 6,825,063 B2 | 11/2004 | Vu et al. |
| 6,841,413 B2 | 1/2005 | Liu et al. |
| 6,888,240 B2 | 5/2005 | Towle et al. |
| 6,894,399 B2 | 5/2005 | Vu et al. |
| 6,902,950 B2 | 6/2005 | Ma et al. |
| 6,964,889 B2 | 11/2005 | Ma et al. |
| 7,067,356 B2 | 6/2006 | Towle et al. |
| 7,071,024 B2 | 7/2006 | Towle et al. |
| 7,078,788 B2 | 7/2006 | Vu et al. |
| 7,109,055 B2 | 9/2006 | McDonald et al. |
| 7,112,467 B2 | 9/2006 | Eichelberger et al. |
| 7,160,755 B2 | 1/2007 | Lo et al. |
| 7,183,658 B2 | 2/2007 | Towle et al. |
| 7,189,596 B1 | 3/2007 | Mu et al. |
| 7,213,329 B2 | 5/2007 | Kim et al. |
| 7,416,918 B2 | 8/2008 | Ma |
| 7,420,273 B2 | 9/2008 | Liu et al. |
| 7,425,464 B2 | 9/2008 | Fay et al. |
| 7,442,581 B2 | 10/2008 | Lytle et al. |
| 7,476,563 B2 | 1/2009 | Mangrum et al. |
| 7,588,951 B2 | 9/2009 | Mangrum et al. |
| 7,595,226 B2 | 9/2009 | Lytle et al. |
| 7,619,901 B2 | 11/2009 | Eichelberger et al. |
| 7,632,715 B2 | 12/2009 | Hess et al. |
| 7,648,858 B2 | 1/2010 | Tang et al. |
| 7,651,889 B2 | 1/2010 | Tang et al. |
| 7,655,502 B2 | 2/2010 | Mangrum et al. |
| 7,659,143 B2 | 2/2010 | Tang et al. |
| 7,902,060 B2 | 3/2011 | Swaminathan |
| 2002/0185309 A1 | 12/2002 | Imamura et al. |
| 2007/0231961 A1* | 10/2007 | Teshirogi et al. ............ 438/107 |
| 2008/0048009 A1 | 2/2008 | Maeda et al. |
| 2008/0054448 A1 | 3/2008 | Lu et al. |
| 2008/0165518 A1 | 7/2008 | Ichiryu et al. |
| 2008/0283387 A1* | 11/2008 | Rice et al. .................. 204/192.1 |
| 2008/0315377 A1 | 12/2008 | Eichelberger et al. |
| 2008/0315391 A1 | 12/2008 | Kohl et al. |
| 2009/0027857 A1 | 1/2009 | Dean et al. |
| 2009/0072012 A1* | 3/2009 | Sakaguchi et al. ............ 228/246 |
| 2009/0072382 A1 | 3/2009 | Guzek |
| 2009/0079063 A1 | 3/2009 | Chrysler et al. |
| 2009/0079064 A1 | 3/2009 | Tang et al. |
| 2009/0166396 A1* | 7/2009 | Supriya et al. ............ 228/179.1 |
| 2009/0212416 A1 | 8/2009 | Skeete |
| 2009/0294942 A1 | 12/2009 | Palmer et al. |
| 2010/0044855 A1 | 2/2010 | Eichelberger et al. |
| 2010/0047970 A1 | 2/2010 | Eichelberger et al. |
| 2010/0159692 A1 | 6/2010 | Swaminathan |
| 2010/0282823 A1* | 11/2010 | Ulicny et al. ................ 228/199 |
| 2011/0101491 A1 | 5/2011 | Skeete et al. |
| 2011/0108999 A1 | 5/2011 | Nalla et al. |
| 2011/0156231 A1 | 6/2011 | Guzek |
| 2011/0215464 A1 | 9/2011 | Guzek et al. |
| 2011/0228464 A1 | 9/2011 | Guzek et al. |
| 2011/0241186 A1 | 10/2011 | Nalla et al. |
| 2011/0241195 A1 | 10/2011 | Nalla et al. |
| 2011/0241215 A1 | 10/2011 | Sankman et al. |
| 2011/0254124 A1 | 10/2011 | Nalla et al. |
| 2011/0266030 A1 | 11/2011 | Swaminathan et al. |
| 2011/0278044 A1 | 11/2011 | Aleksov et al. |
| 2011/0278351 A1 | 11/2011 | Aleksov et al. |
| 2011/0291276 A1 | 12/2011 | Swaminathan et al. |
| 2012/0001339 A1 | 1/2012 | Malatkar |
| 2012/0009738 A1 | 1/2012 | Crawford et al. |
| 2012/0049382 A1 | 3/2012 | Malatkar |

OTHER PUBLICATIONS

"Yale Scientists Develop Magnetic Lead-free Solder", SMT Magazine Archive, Mar. 8, 2010, Retrieved on Dec. 6, 2010, Document Available at: <http://www.ems007.com/pages/zone.cgi?a=60208&artpg=1, 2 pages.

Calabro, Joshua D., et al. "Magnetically Driven Three-Dimensional Manipulation and Inductive Heating of Magnetic-Dispersion Containing Metal Alloys", Department of Mechanical Engineering, Yale University, New Haven, CT 06520; and Department of Materials Science and Engineering, Massachusetts Institute of Technology, Cambridge, PNAS, Mar. 16, 2010, vol. 107 No. 11 pp. 4834-4839.

McCormack, M. et al., "Enhanced Solder Alloy Performance by Magnetic Dispersions", IEEE Transactions on Components, Packaging, and Manufacturing Technology-Part A, vol. 17, No. 3, Sep. 1994, pp. 452-457.

Suwanwatana, W. et al., "Influence of particle size on hysteresis heating behavior of nickel particulate polymer films", Elsevier, Composites Science and Technology 66, May 30, 2006, pp. 2825-2836.

U.S. Appl. No. 12/787,968, filed May 26, 2010, 29 pages.
U.S. Appl. No. 12/778,313, filed May 12, 2010, 43 pages.
U.S. Appl. No. 12/777,476, filed May 11, 2010, 41 pages.
U.S. Appl. No. 12/768,842, filed Apr. 28, 2010, 33 pages.
U.S. Appl. No. 11/860,922, filed Sep. 25, 2007, 19 pages.
U.S. Appl. No. 12/590,350, filed Nov. 6, 2009, 20 pages.
U.S. Appl. No. 12/655,321, filed Dec. 29, 2009, 26 pages.
U.S. Appl. No. 12/655,335, filed Dec. 29, 2009, 36 pages.
U.S. Appl. No. 12/761,782, filed Apr. 16, 2010, 36 pages.
U.S. Appl. No. 12/755,183, filed Apr. 6, 2010, 21 pages.
U.S. Appl. No. 12/755,201, filed Apr. 6, 2010, 23 pages.
U.S. Appl. No. 12/725,925, filed Mar. 17, 2010, 34 pages.
U.S. Appl. No. 12/753,637, filed Apr. 2, 2010, 34 pages.
U.S. Appl. No. 09/640,961, filed Aug. 16, 2000, 70 pages.
Office Action received for U.S. Appl. No. 12/343,341, mailed on Sep. 15, 2010, 9 pages.
U.S. Appl. No. 12/827,323, filed Jun. 30, 2010, 28 pages.
U.S. Appl. No. 12/868,816, filed Aug. 26, 2010, 23 pages.
U.S. Appl. No. 12/830,875, filed Jul. 6, 2010, 41 pages.

\* cited by examiner

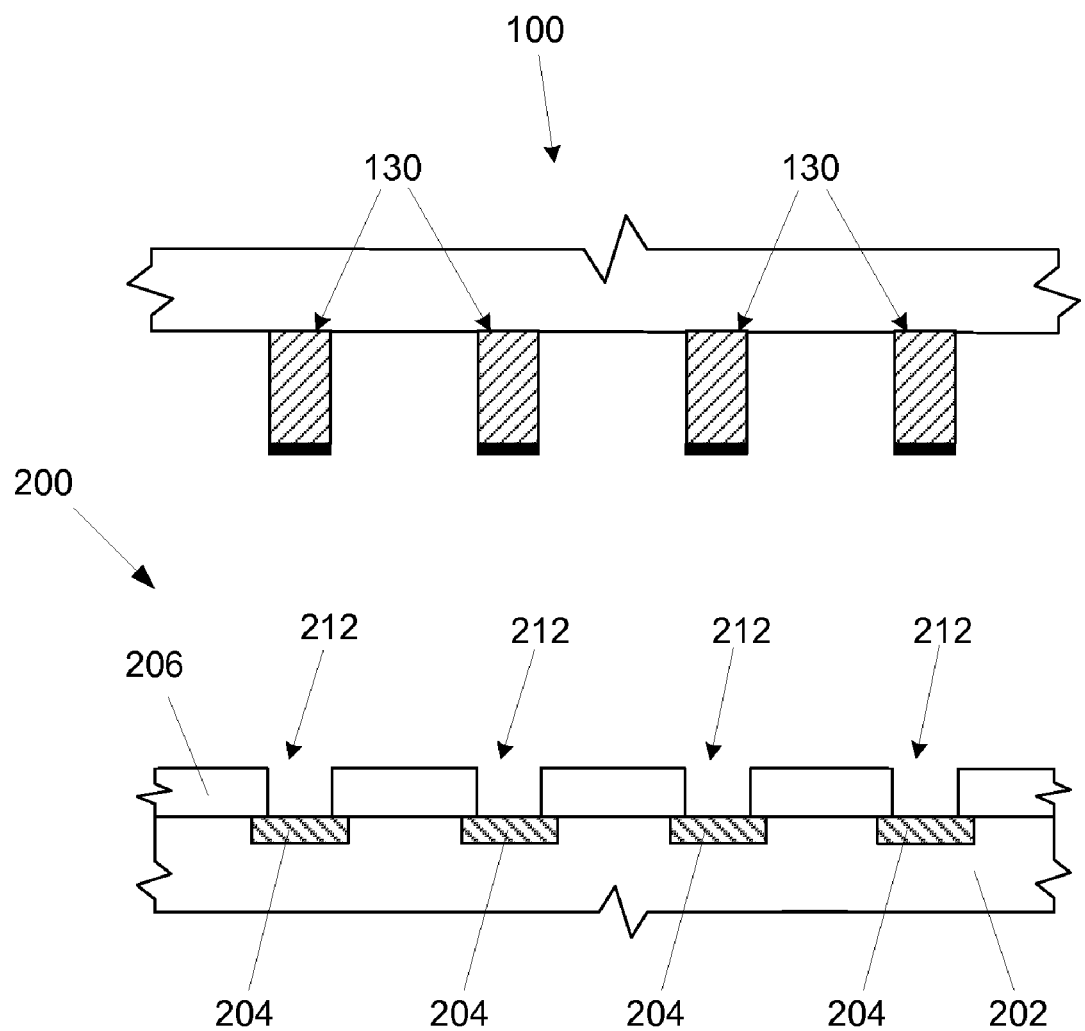
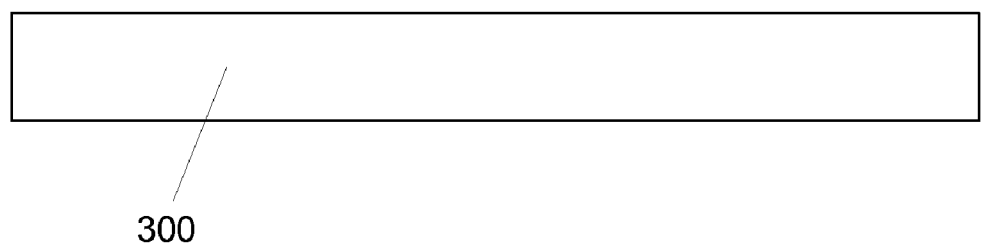
FIG. 7

MAGNETIC MICROELECTRONIC DEVICE ATTACHMENT

BACKGROUND

A typical microelectronic package includes at least one microelectronic die that is mounted on a substrate such that bond pads on the microelectronic die are attached directly to corresponding bond lands on the substrate using reflowable solder materials.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

FIGS. 6-11 illustrate side cross-sectional views of a process of forming a microelectronic package with the magnetic attachment structure of FIG. 5;

DETAILED DESCRIPTION

Figure 1:
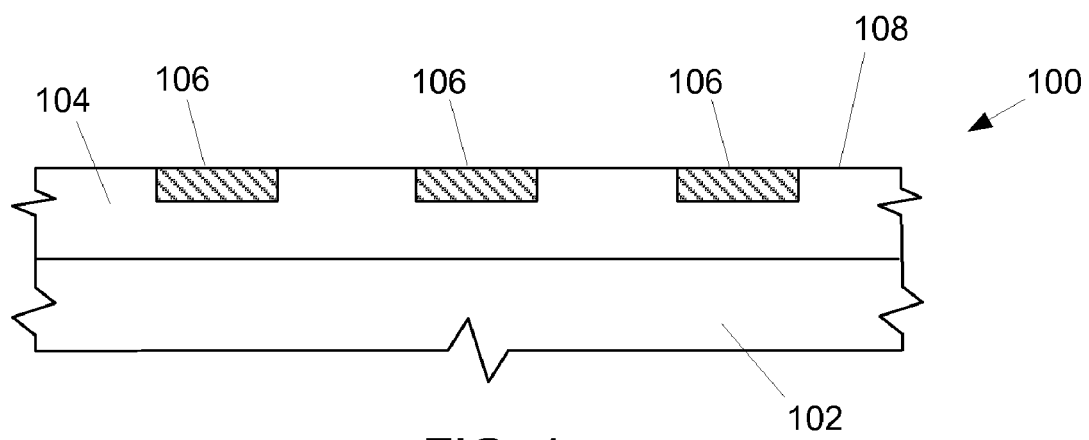
FIGS. 1-5 illustrate side cross-sectional views of a process of forming a magnetic attachment structure.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating microelectronic packages, wherein microelectronics of the microelectronic packages may have magnetic attachment structures comprising a magnetic material formed on an attachment structure. The microelectronic device may be aligned on a substrate with a magnetic field and then held in place therewith while being attached to the substrate. The microelectronic device may also be aligned with an alignment plate which magnetically aligns and holds the microelectronic device in place while being packaged.

In the production of microelectronic packages, microelectronic dice are generally mounted on substrates that may, in turn, be mounted to boards, which provide electrical communication routes between the microelectronic dice and external components. A microelectronic die, such as a microprocessor, a chipset, a graphics device, a wireless device, a memory device, an application specific integrated circuit, or the like, may be attached to a substrate, such as an interposer, a motherboard, and the like, through a plurality of interconnects, such as reflowable solder bumps or balls, in a configuration generally known as a flip-chip or controlled collapse chip connection ("C4") configuration. When the microelectronic die is attached to the substrate with interconnects made of solder, the solder is reflowed (i.e. heated) to secure the solder between the microelectronic die bond pads and the substrate bond pads. The microelectronic die may also be attached with a thermo-compression bonding process to form an interconnection between an attachment structure of the microelectronic die and the substrate bond pad, as will be understood to those skilled in the art.

As microelectronic dice become smaller, it becomes more difficult to align microelectronic die on an interposer. The difficulty in aligning microelectronic dice means that the pitch of interconnects cannot be reduced without increasing yield loss at the microelectronic die-substrate interface, as will be understood to those skilled in the art.

FIG. 1 shows a microelectronic device 100, which may be a microelectronic die, including, but not limit to microprocessor, a chipset, a graphics device, a wireless device, a memory device, an application specific integrated circuit, or the like. The microelectronic device 100 may comprise a microelectronic substrate 102, such as an amorphous silicon or a silicon-germanium wafer, having an interconnect layer 104 formed thereon. The interconnect layer 104 may be a plurality of dielectric layers (not shown) having conductive traces (not shown) formed thereon and therethrough. The interconnect layer 104 forms conductive routes from integrated circuits (not shown) formed in and on the microelectronic substrate 102 to at least one conductive land 106 formed proximate an outer surface 108 of the interconnect layer 104.

The plurality of dielectric layers of the interconnect layer 104 may be any appropriate dielectric material, including but not limited to a silicon oxide, silicon nitride, and low-K dielectric materials (i.e. dielectric materials with a dielectric constant "K" lower than that of silicon oxide), including but not limited to carbon doped silicon dioxide and fluorine doped silicon dioxide. The plurality of conductive traces of the interconnect layer 104 may be any appropriate electrically conductive material, including but not limited to copper, aluminum, silver, gold, or alloys thereof.

Figure 2:
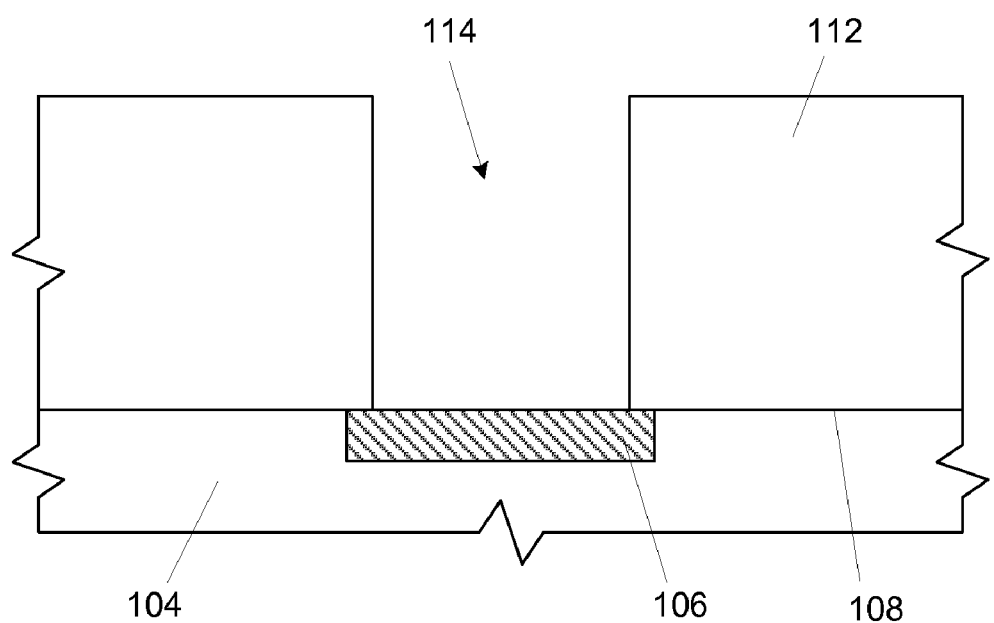

FIG. 2 illustrates a closer view of the interconnect layer 104 of FIG. 1, which may have a mask 112 patterned on the interconnect layer outer surface 108. The mask 112 may have an opening 114 extending therethrough to expose at least a portion of the conductive land 106. In one embodiment, the mask 112 may be a photoresist material, which may be patterned by lithographic techniques known in the art.

Figure 3:
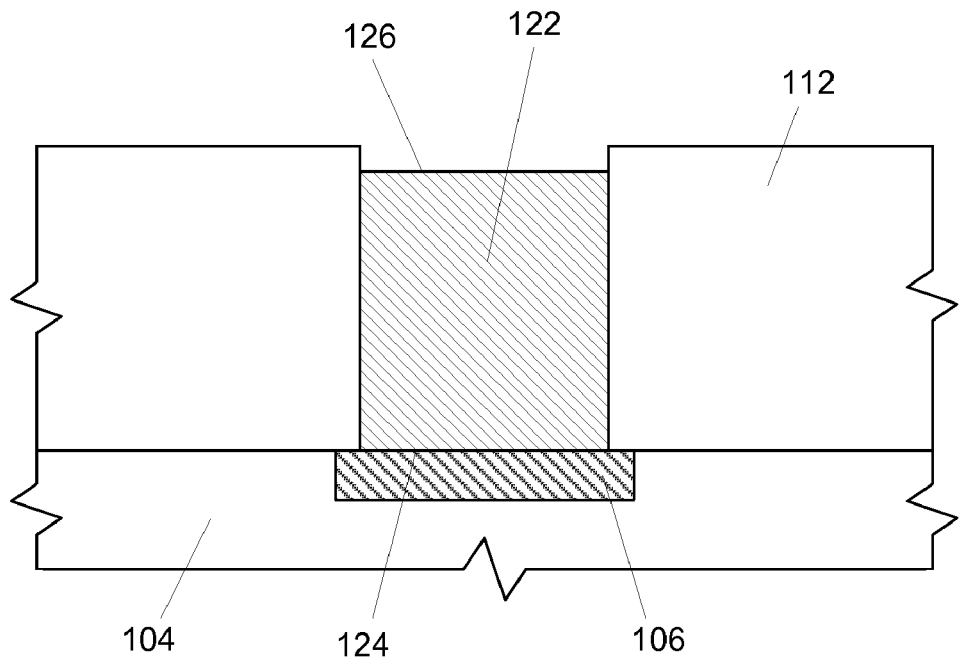

As shown in FIG. 3, a conductive material 122 may be deposited on the conductive land 106 within the mask opening 114. The conductive material 122 may include, but is not limited to, copper and alloys thereof. The conductive material 122 may be deposited with a plating process, including but not limited to electroplating and electroless plating. Additionally, the conductive material 122 may be deposited by various deposition techniques, such as sputtering or vapor deposition. The conductive material has a device end 124 proximate the contact land 106 and an opposing projection end 126.

Figure 4:
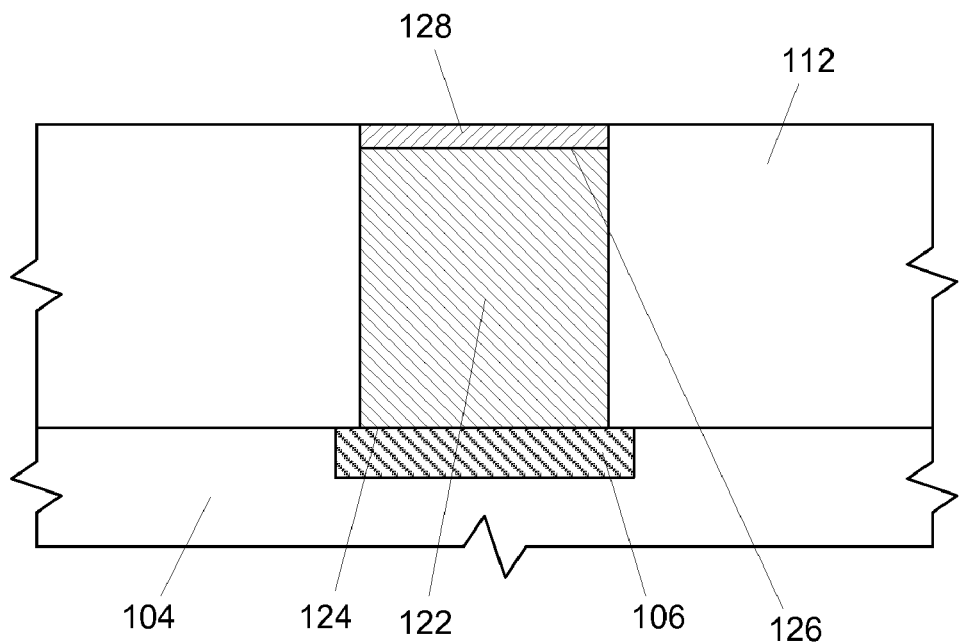
Figure 5:
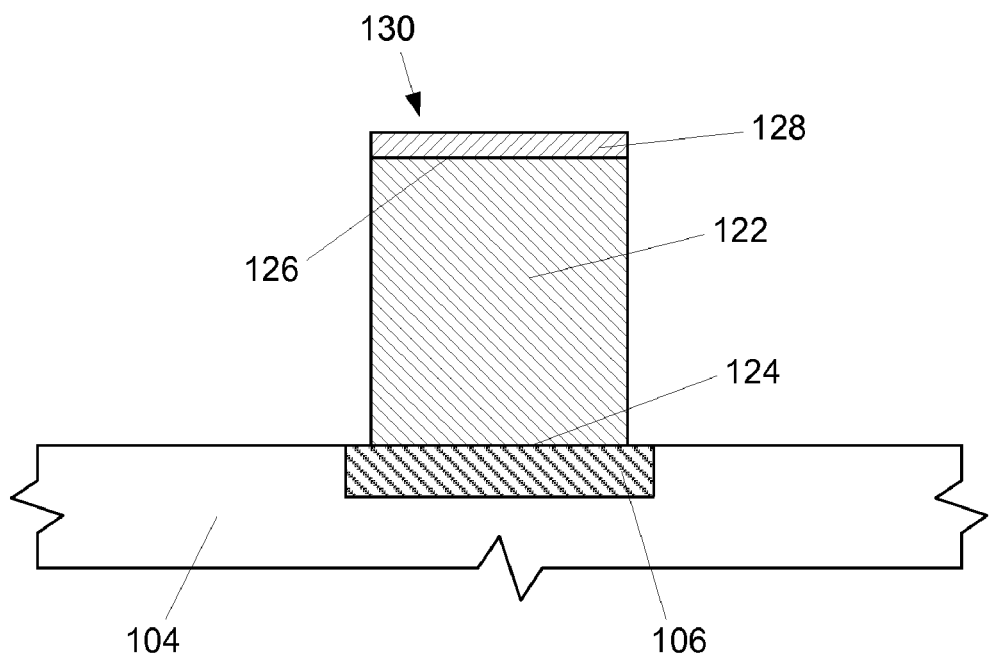

As shown in FIG. 4, a magnetic material 128 may be deposited on the conductive material projection end 126 within the mask opening 114. The magnetic material 128 may be plated by any technique known in the art, including but not limited to electroplating and electroless plating. Additionally, the magnetic material 128 may be deposited by various deposition techniques, such as sputtering or vapor deposition. The magnetic material 128 may include any magnetic material that is capable of being plated, including, but are not limited to, iron (Fe), cobalt (Co), nickel (Ni), and their respective alloys, such a iron/cobalt, iron/nickel, iron/tin, and the like. After depositing the magnetic material 128, the mask 112 may be removed, thereby forming a magnetic attachment structure 130, as shown in FIG. 5.

Figure 6:
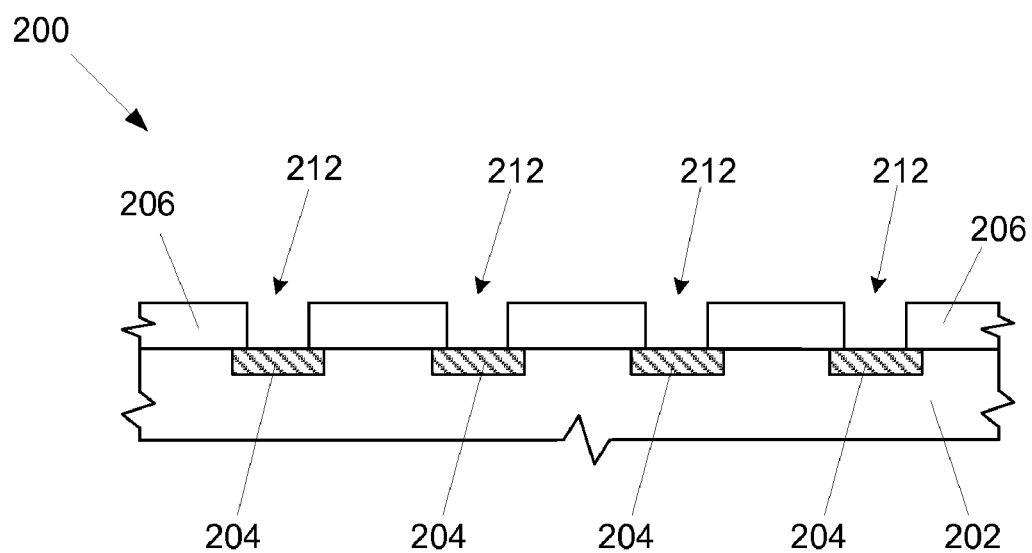

As shown in FIG. 6, a substrate 200, such as an interposer or a printed circuit board, may be provided having at least one attachment structure, such as bond pads 204, formed therein. The substrate 200 may be primarily composed of any appropriate structure material 202, including, but not limited to, bismaleimine triazine resin, fire retardant grade 4 material, polyimide materials, glass reinforced epoxy matrix material, and the like, as well as laminates or multiple layers thereof. The substrate bond pads 204 may be composed of any conductive metal, including but not limited to, copper, aluminum, and alloys thereof. The substrate bond pads 204 may also comprise magnetic materials, including, but are not limited to, iron (Fe), cobalt (Co), nickel (Ni), and their respective alloys, such as on a finishing layer of the substrate bond pad 204, as will be understood to those skilled in the art. The substrate bond pads 204 may be in electrical communication with conductive traces (not shown) within the substrate structure material 202.

An outer dielectric layer 206 may be patterned adjacent the substrate structure material 202 and the substrate bond pads 204, and may have at least opening 212 patterned therethrough to expose at least a portion of each substrate bond pad 204. The outer dielectric layer 206 may be a solder resist material, including but not limited to epoxy and epoxy-acrylate resins. The substrate structure material 202, substrate bond pad 204, and the outer dielectric layer 206 may be formed by any known technique, as will be understood by those skilled in the art.

Figure 8:
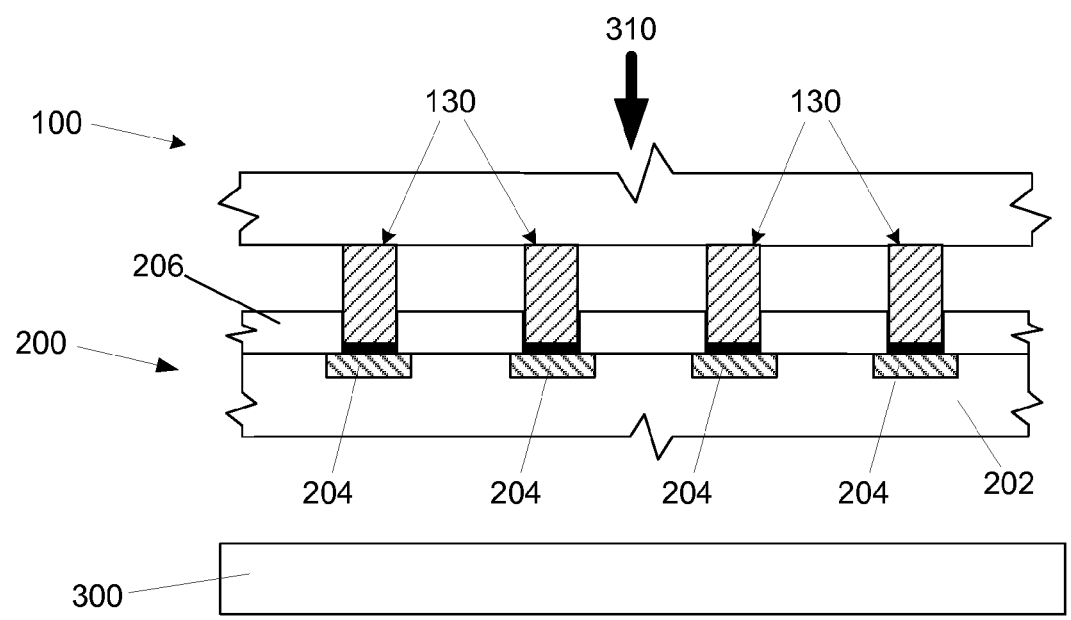

As shown in FIG. 7, the microelectronic device 100 may be placed proximate the substrate 200, which is placed proximate a magnet device 300. The magnet device 300 may be any appropriate magnet system which generates a magnetic field, including but not limited to a permanent magnet or an electromagnet. As shown in FIG. 8, the magnet device 300 may be positioned to attract the magnetic material 128 of the magnetic attachment structure 130 of the microelectronic devices 100 toward and align with the substrate bond pads 204, as illustrated as arrow 310.

The magnet device 300 secures the microelectronic device 100 in place within its magnetic field once aligned and holds the microelectronic device 100 in place through subsequent processing steps. By securing the microelectronic device 100 such that is it remains in place during subsequent processing steps and by using a high precision microelectronic device alignment process (such as the magnetic-based alignment system described herein), the embodiments of the present disclosure can yield significantly higher interconnection density compared to known methods.

Figure 9:
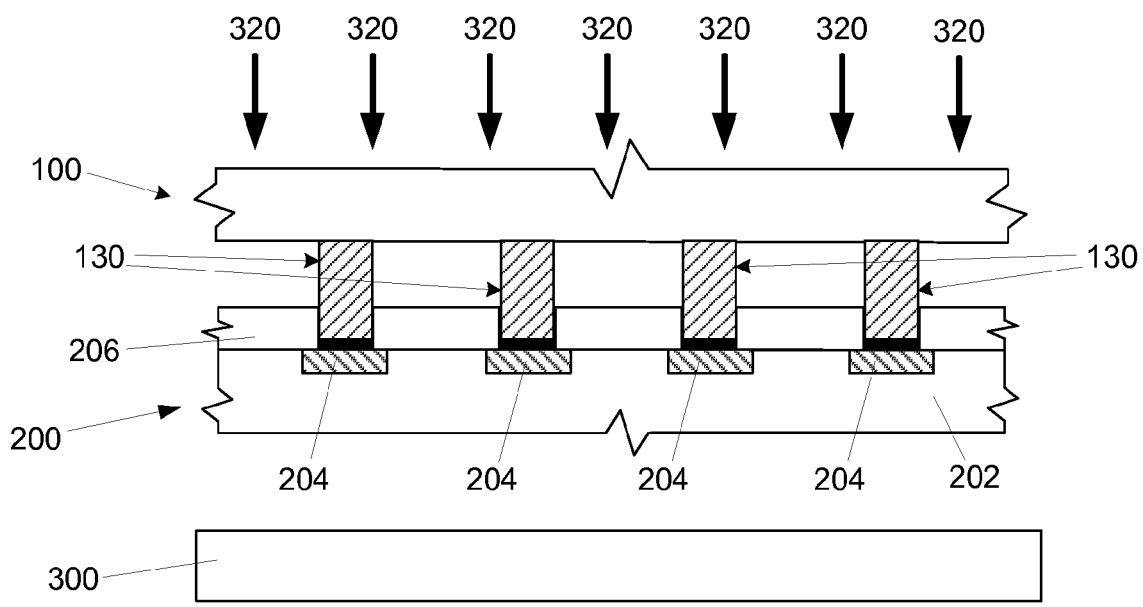
Figure 10:
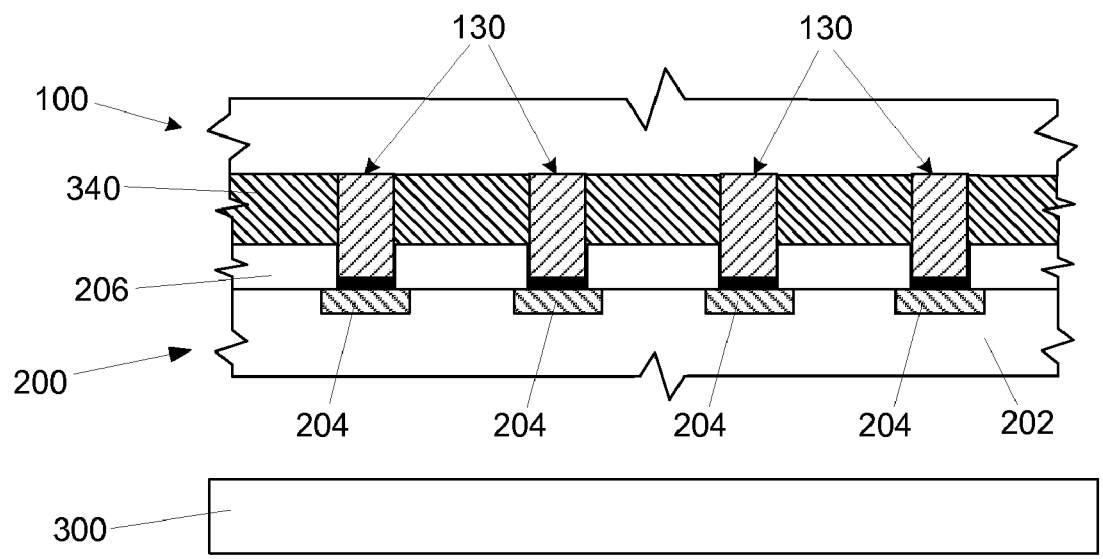

The magnetic attachment structures 130 may be attached to the substrate bond pads 204, as shown in FIG. 9, such as by a thermo-compression process which utilizes heat and pressure (shown as arrows 320) to form the attachment, as will be understood to those skilled in the art. As shown in FIG. 10, an underfill material 340, such as an adhesive dielectric material, including but not limited to an epoxy resin, may be disposed between the microelectronic device 100 and the substrate 200. The underfill material 340 is generally used to provide mechanical support, contamination protection, and improves package reliability. The underfill material 340 may then be cured (solidified or hardened through cross-linking of polymers within the underfill material 340), such as by heating, in the presence of the magnetic field, which may improve the mechanical properties of the underfill material 340 compared to the mechanical properties of the underfill material 340 cured without a magnetic field.

Figure 11:
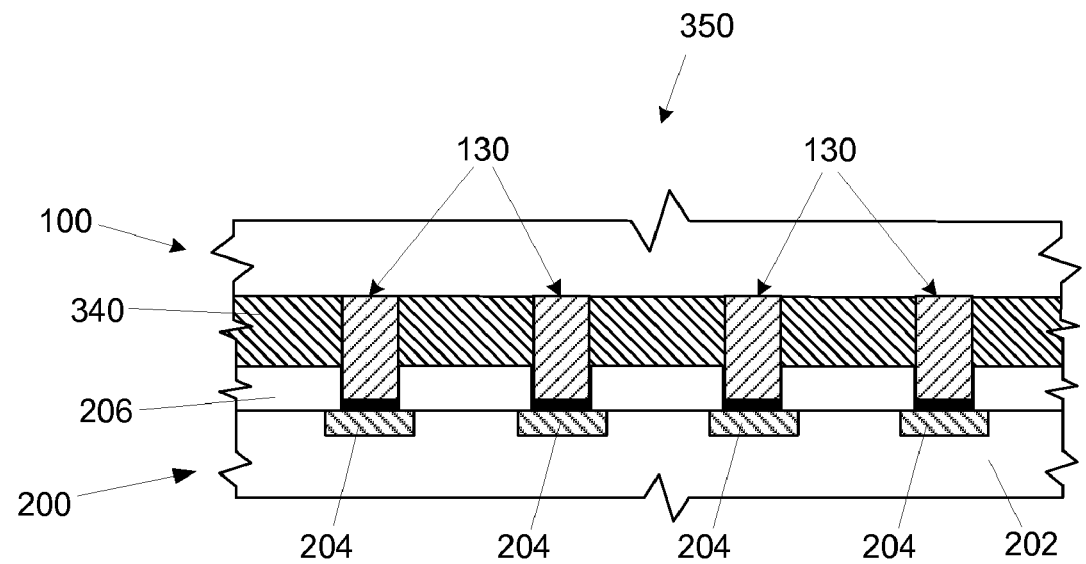

The magnet device 300 may then be deactivated, or the substrate 200 and the attached microelectronic device 100 may be removed from the precise of the magnet device 300, resulting in microelectronic package 350, as shown in FIG. 11.

When a thermo-compression bonding process is used, the magnet device 300 can give resistance to the microelectronic device 100 as it attempts to spring back when the pressure 320 is released after attachment, and, thus, may improve reliability of attachment. Furthermore, the use of the magnetic material 128 may improve the current maximum ("Imax") of each magnetic attachment structure 130, as will be understood to those skilled in the art.

It is understood that the microelectronic device 100 could be could be aligned on the substrate 200 with a optical system known in the art, rather than by the magnetic field generated by the magnet device 300, followed by attachment in the magnetic field as described.

Figure 12:
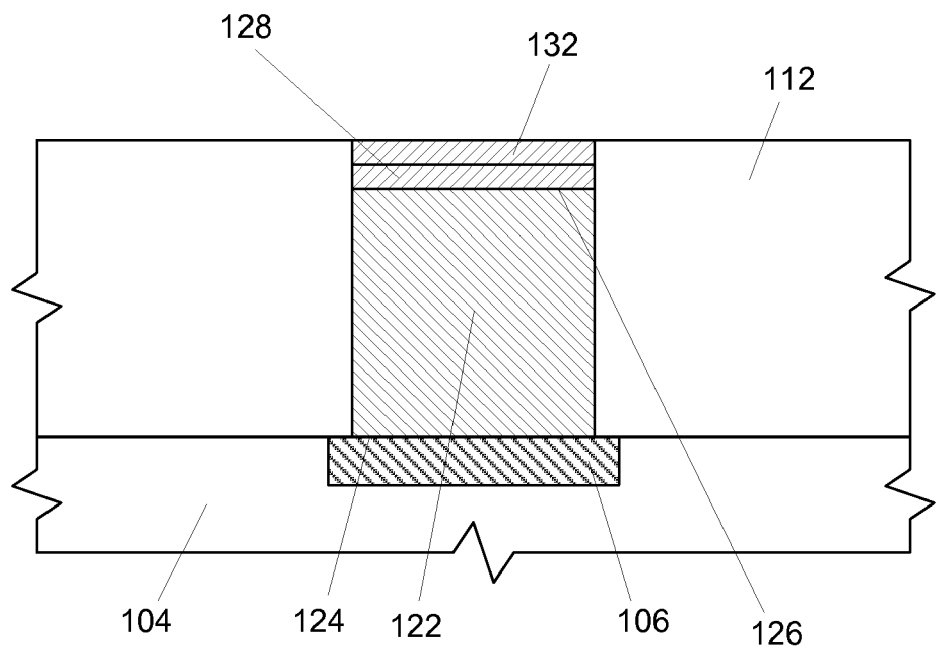
FIGS. 12 and 13 illustrate side cross-sectional views of a process of forming another magnetic attachment structure.
Figure 13:
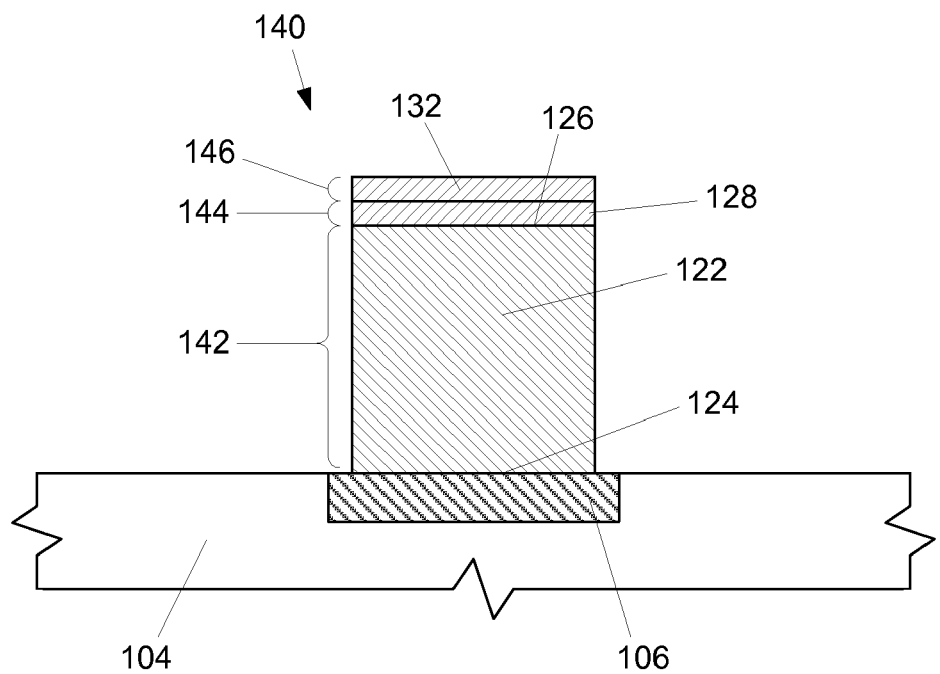

FIGS. 12 and 13 illustrate another embodiment of the magnetic attachment structure of the present description. Beginning with FIG. 4, a solder cap 132 may be deposited on the magnetic material 128, as shown in FIG. 12. The solder cap 132 may be formed of any appropriate solder material, including but not limited to lead/tin alloys, such as tin/lead solder, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys, and pure indium and indium based alloys, such as indium/silver and indium/tin. In one embodiment, the solder cap 132 is tin. In another embodiment, the conductive material 122 may be copper and may have a thickness 142 of about 10 um, the magnetic material 128 may be iron and may have a thickness 144 of about 6.5 um, and the solder cap 132 may be tin and may have a thickness 146 of about 6.5 um (see FIG. 13).

After depositing the solder cap 132, the mask 112 may be removed, thereby forming a capped magnetic attachment structure 140, as shown in FIG. 13.

Figure 14:
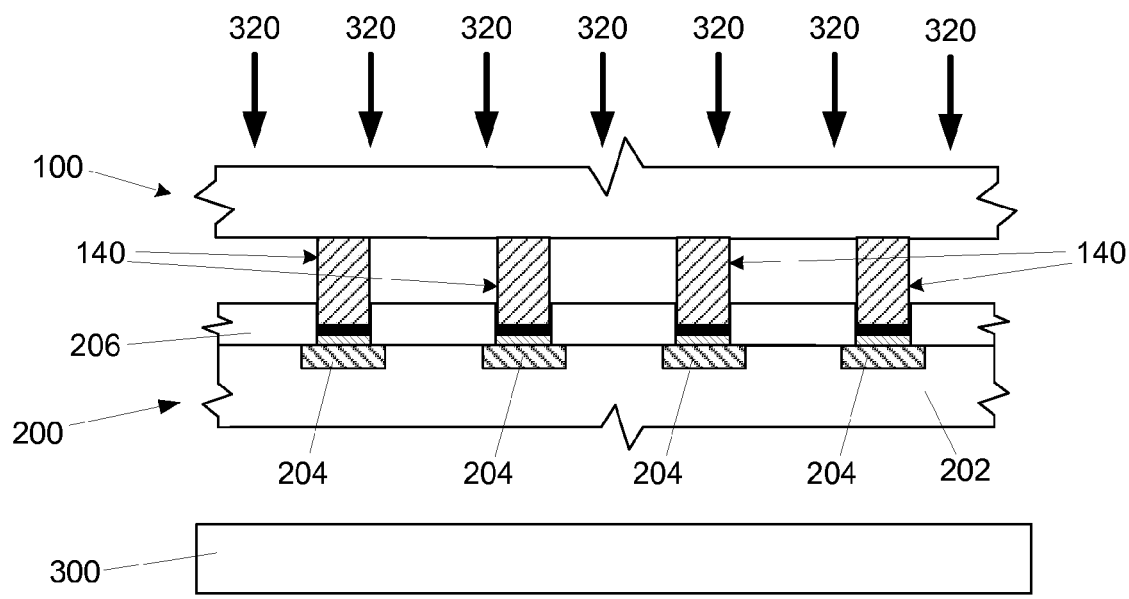
FIGS. 14-16 illustrate side cross-sectional views of a process of forming a microelectronic package with the magnetic attachment structure of FIG. 13.
Figure 15:
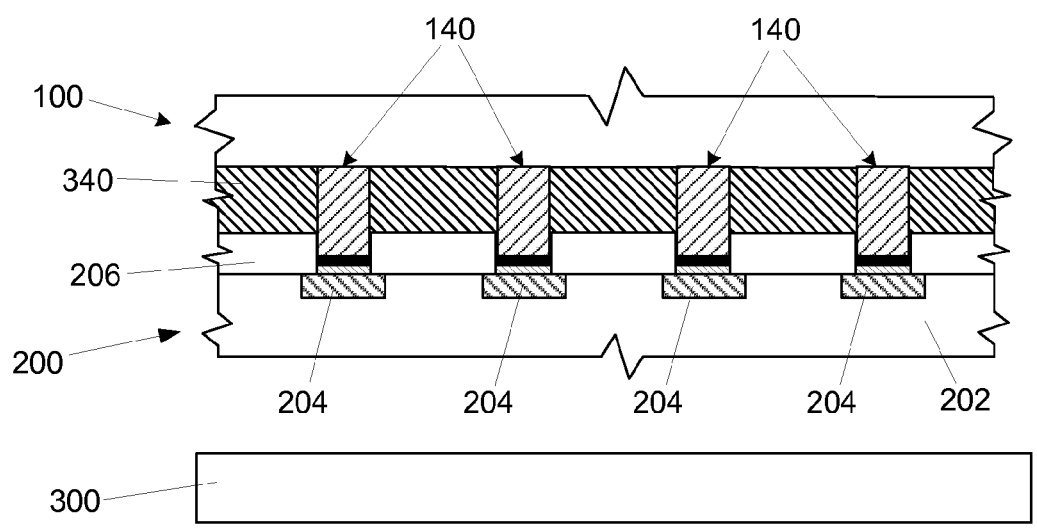

As shown in FIG. 14, the substrate 200 may be provided having bond pad 204 and the outer dielectric layer 206 with the openings 212 patterned therethrough to expose at least a portion of the substrate bond pads 204. The microelectronic device 100 having a plurality of capped magnetic attachment structures 140 may be placed proximate the substrate 200, which is placed proximate a magnet device 300, such that the magnetic material 128 of the capped magnetic attachment structure 140 of the microelectronic devices 100 is drawn toward and align with the bond pads 204 of the substrate 200, similar that which was described in FIGS. 6-9. The capped microelectronic attachment structures 140 may be attached to the substrate bond pads 204, such as by a thermo-compression process which utilizes heat and pressure (shown as arrows 320) to form the attachment therebetween, wherein the solder cap 132 assists in forming the attachment. As shown in FIG. 15, the underfill material 340 is disposed between the microelectronic device 100 and the substrate 200. The underfill material 340 may then be cured in the presence of the magnetic field.

Figure 16:
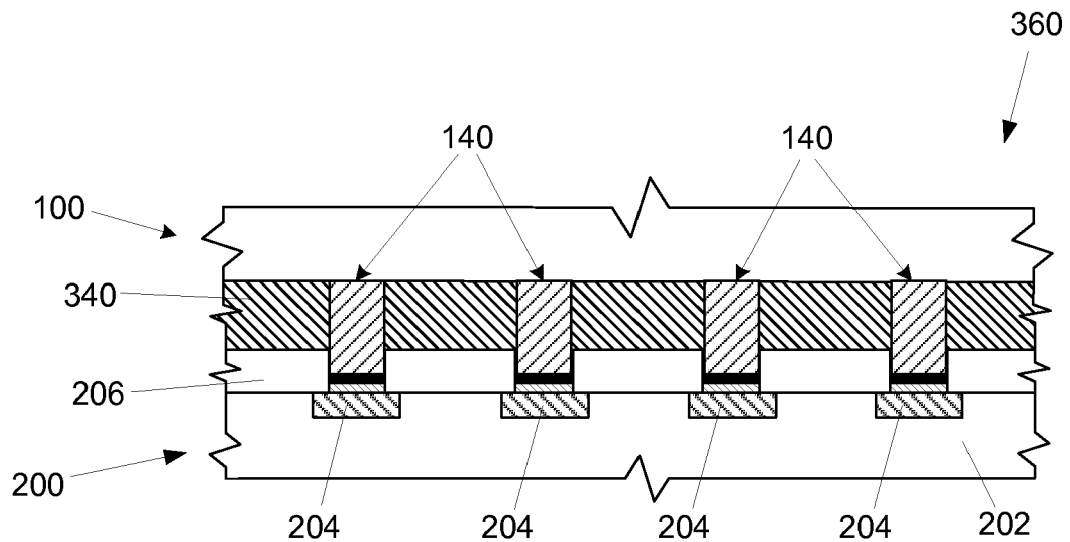

The magnet device 300 may then be deactivated, or the substrate 200 and the attached microelectronic device 100 may be removed from the precise of the magnet device 300, resulting in microelectronic package 360, as shown in FIG. 16.

As will be understood to those skilled in the art, since the capped magnetic attachment structure 140 has the solder cap 132, the solder cap 132 may form the attachment through reflowing of the solder cap 132 without compression. Further, when the conductive material 122 is copper or an alloy thereof, the solder cap 132 may prevent the consumption of the copper, which can cause early maximum current ("Imax") failure, as will be understood to those skilled in the art.

Figure 17:
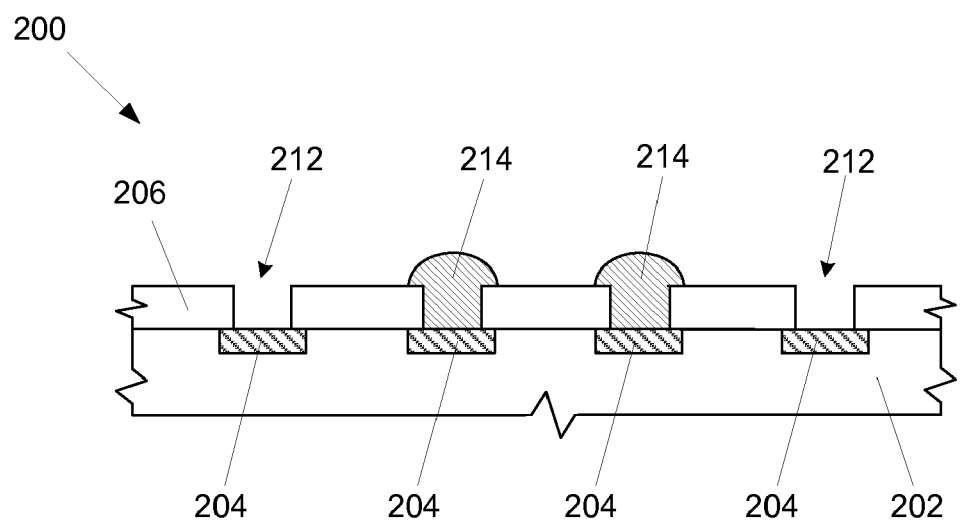
FIGS. 17-20 illustrate side cross-sectional views of a process of forming a microelectronic package with the magnetic attachment structures and at least one solder interconnect.

The magnetic attachment structures of the present invention may be used in conjunction with solder attachment techniques. As shown in FIG. 17, at least one solder interconnect bump 214 can be formed through at least one opening in the outer dielectric material 206 of the substrate 200, by any known techniques, including but not limited to printing. The solder interconnect bumps 214 may be any appropriate solder material, including but not limited to lead/tin alloys, such as tin/lead solder, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys, and pure indium and indium based alloys, such as indium/silver and indium/tin. In one embodiment, the solder interconnect bump 214 may be tin/silver/copper alloy (96.5% tin/3.0% silver/0.5% copper), known as SAC305.

Figure 18:
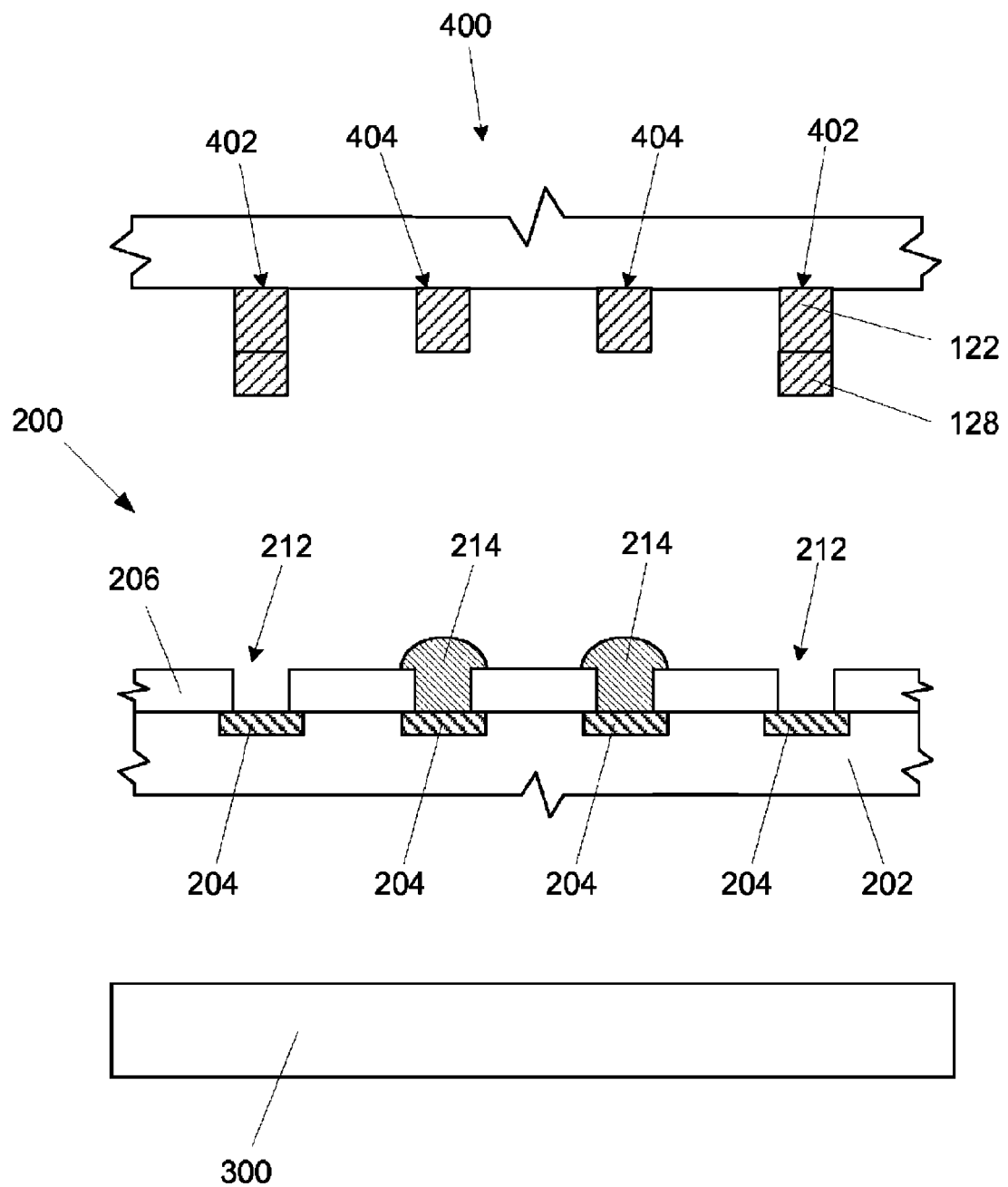
Figure 19:
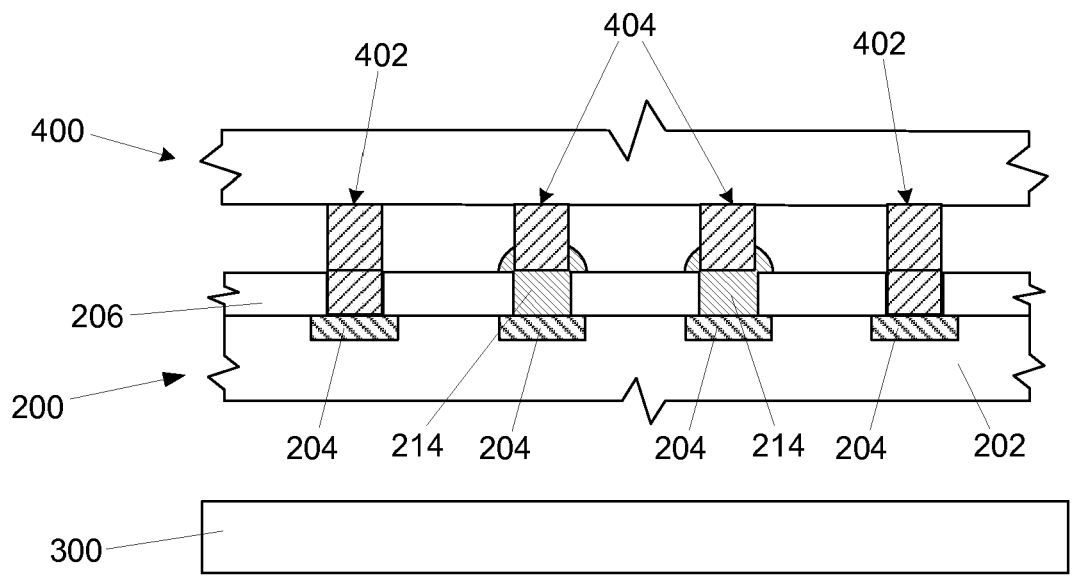

As shown in FIG. 18, a microelectronic device 400 may be provided which has at least one magnetic attachment structure 402 (such as magnetic attachment structure of 130 of FIG. 5 or magnetic attachment structure 140 of FIG. 13) and which has at least one attachment structure 404 that is lacking the magnetic material 128 (see FIG. 5). The substrate 200 can be heated to a reflow temperature of the solder interconnect bump 214. The microelectronic device 400 may be placed proximate the substrate 200, which is placed proximate the magnet device 300, such that the magnetic material 128 of the magnetic attachment structure 402 of the microelectronic devices 400 is drawn toward and align with the bond pads 204 of the substrate 200, while the attachment structures 404 may be simultaneously brought into contact with their respective reflowed solder interconnect bumps 214. The heat may then be discontinued to allow the solder interconnect bumps 214 to cool and re-solidify to form an interconnection between the solder interconnect bumps 214 and the attachment structures 404, as shown in FIG. 19. The underfill material 340 may be disposed between the microelectronic device 400 and the substrate 200 and cured in the presence of the magnetic field.

Figure 20:
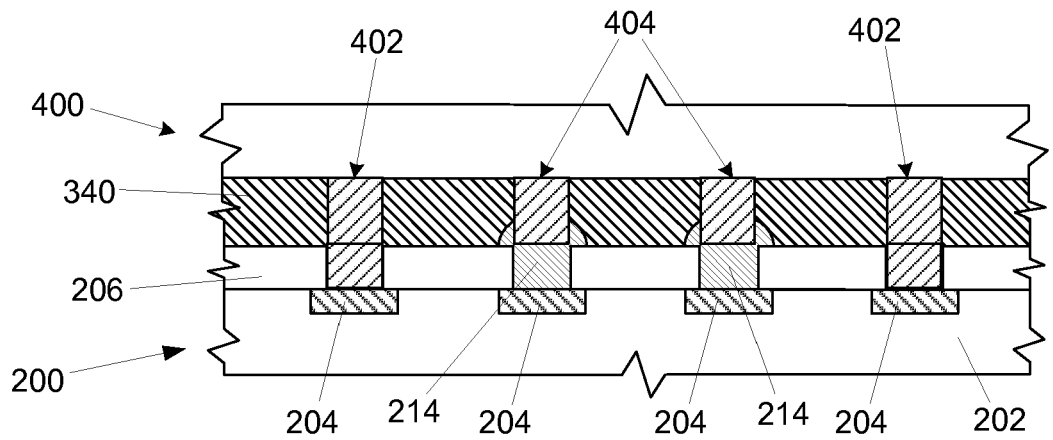

The magnetic device 300 may then be deactivated, or the substrate 200 and the attached microelectronic device 400 may be removed from the magnetic field, which forms the microelectronic device package 410, as shown in FIG. 20.

Although the described embodiments within this description are directed to specific substrates and microelectronic devices, it is understood that the concepts apply equally to any appropriate microelectronic packaging process, including but not limited to First Level Interconnects (FLI) where microelectronic dice are attached to substrates or interposers, to Second Level Interconnects (SLI) where substrates or interposers are attached to a board or a motherboard, and to Direct Chip Attach (DCA) where microelectronic dice are attached directly to a board or a motherboard.

It is also understood that the subject matter of the present description is not necessarily limited to specific applications illustrated in FIGS. 1-20. The subject matter may be applied to other solder attachment processes in the fabrication of microelectronic devices, including, but not limited to, attachment of devices to a motherboard, attachment, and the like. Furthermore, the subject matter may also be used in any appropriate application outside of the microelectronic device fabrication field.

The magnetic attachment structures of the present description may be used in the fabrication of Bumpless Build-Up Layers ("BBUL") package structures. A BBUL package may comprise a plurality of microelectronic devices that are aligned with their active surfaces facing in a common direction. A substrate material may be disposed between the microelectronic devices which binds the microelectronic devices and forms a BBUL substrate having a surface of the structure material substantially planar to the active surfaces of the microelectronic dice. This planar BBUL may be used to form an interconnect layer comprising a plurality of dielectric layers (not shown) having conductive traces formed thereon and therethrough. The interconnect layer forms conductive routes between integrated circuits (not shown) of the microelectronic devices and/or to conductive lands formed proximate an outer surface of the interconnect layer, as previously described.

Figure 21:
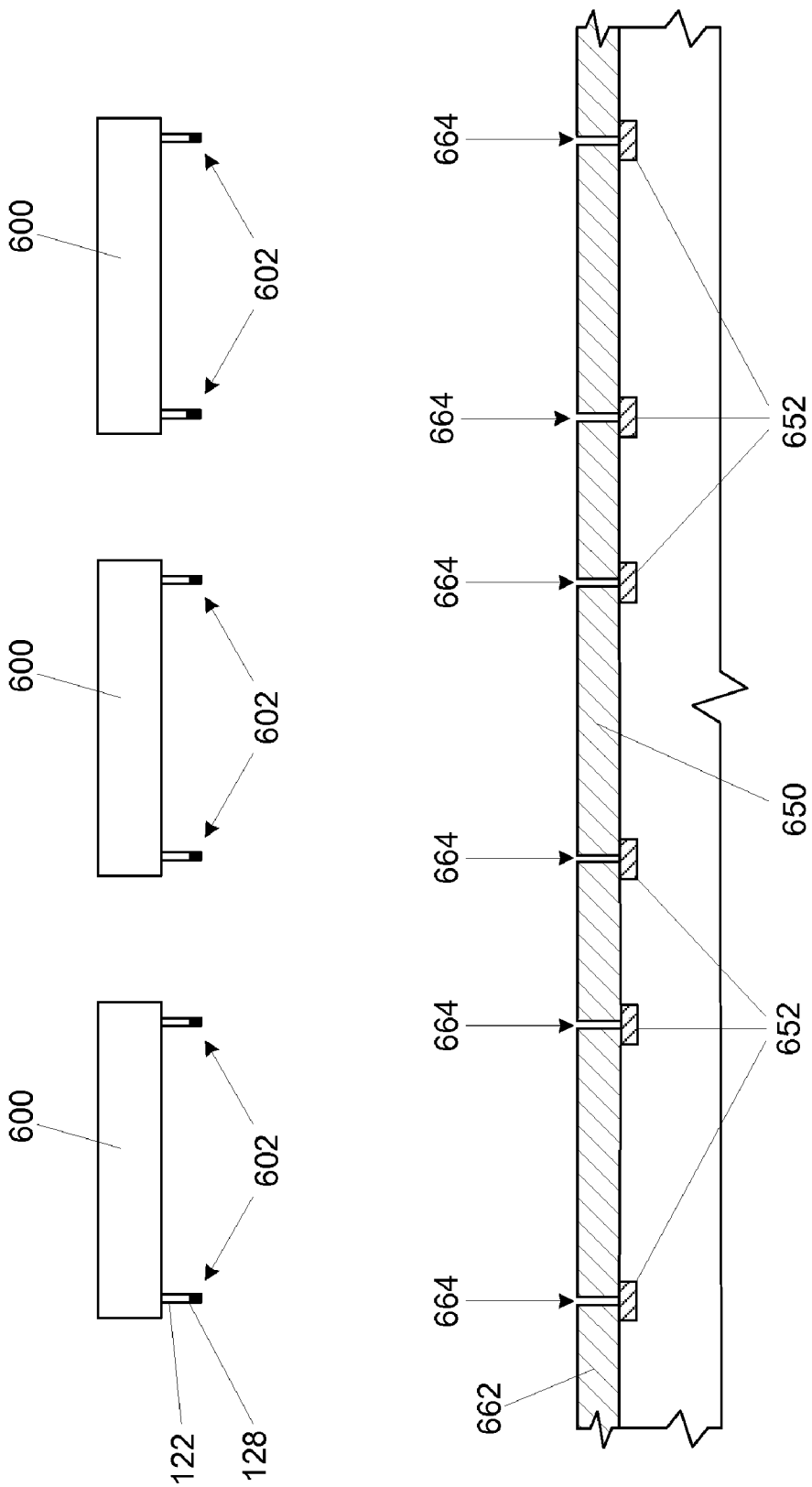
FIGS. 21-25 illustrate side cross-section views of a process of forming a bumpless build-up layer package with a magnetic attachment structure.

As shown in FIG. 21, a plurality of microelectronic devices 600 may be provided each having at least one magnetic attachment structure 602 formed thereon comprising a conductive material 122 and a magnetic material 128, similar to the magnetic attachment structure 130 of FIG. 5. A substrate, such as an alignment plate 650, may also be provided. The alignment plate 650 may include at least one magnet device, such as a magnetic alignment device 652, embedded in the alignment plate 650 proximate a contact surface 654 thereof. The magnetic alignment devices 652 may be any appropriate magnetic system which generates a magnetic field, including but not limited to a permanent magnets or electromagnets. The alignment plate 650 may have a dielectric material 662 disposed on the alignment plate contact surface 654 with at least one opening 664 patterned therethrough to expose at least a portion its respective magnetic alignment device 652.

Figure 22:
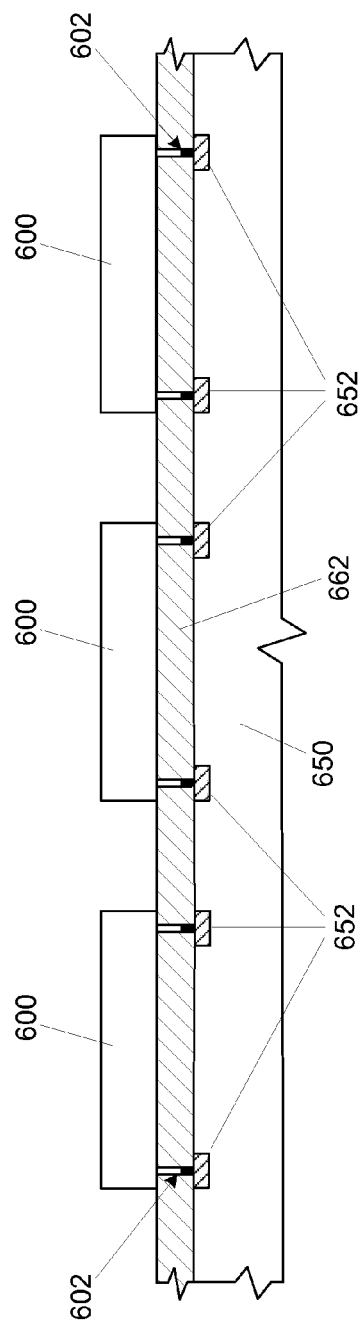

As shown in FIG. 22, the microelectronic devices 600 are positioned such that magnetic attachment structures 602 are inserted into the dielectric material openings 664 and aligned. The alignment may occur with an optical alignment system (not shown), with the magnet device 300 (if used) (see FIG.

Figure 23:
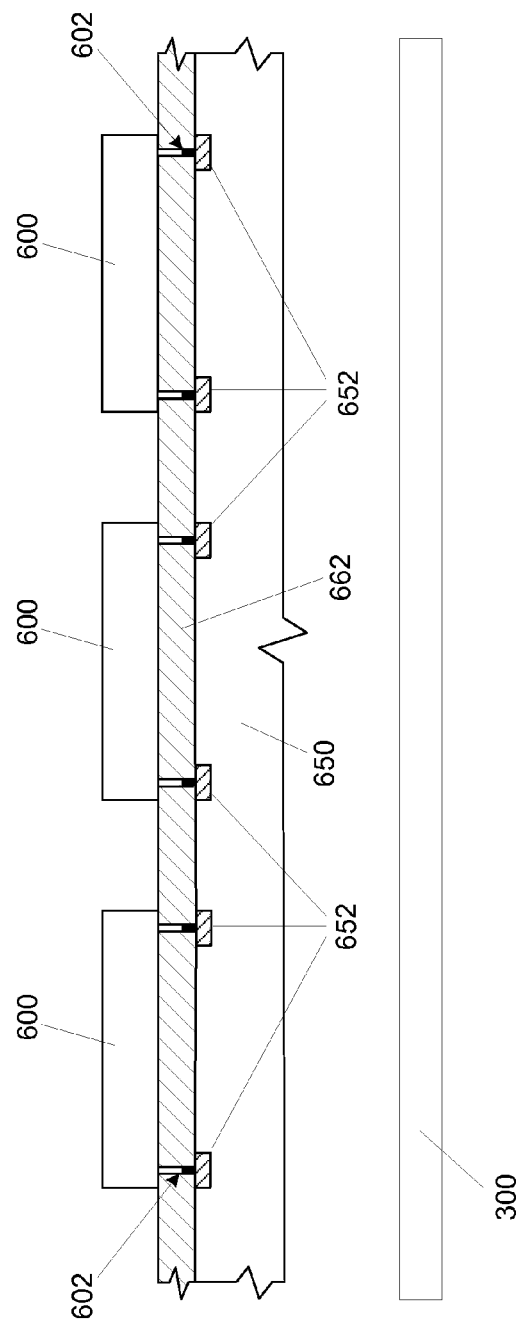

23), or with the magnetic alignment devices 662 themselves. The microelectronic devices 600 may be held into position by the magnetic alignment devices 662, or if the magnetic alignment devices 662 are to be used for alignment purposes only, the magnet device 300 may be used to secure the microelectronic device 300, as shown in FIG. 23. By securing the microelectronic devices 600 such that is it remains in place during subsequent processing steps and by using a high precision microelectronic device alignment process (such as the magnetic-based alignment system described herein), the embodiments of the present disclosure can yield significantly higher alignment precision compared to known methods.

Figure 24:
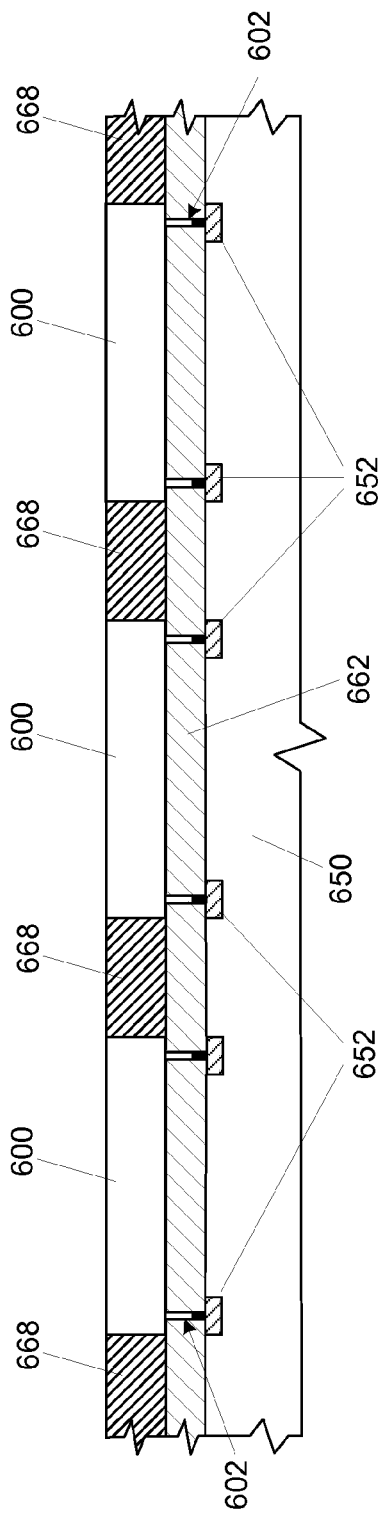
Figure 25:
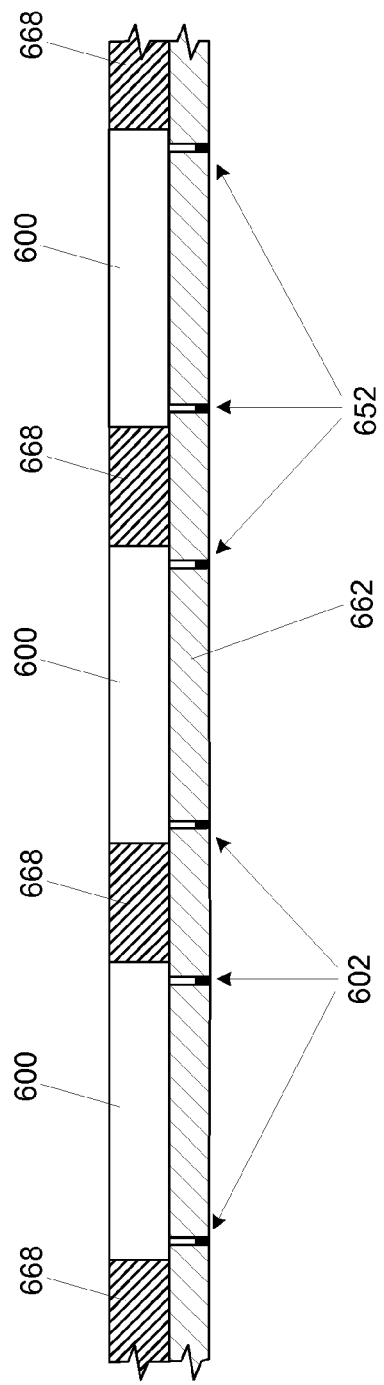

Once the microelectronic devices 600 are aligned and secured in place, a core material 668 may be disposed between the microelectronic devices 600, such that it adheres to the microelectronic devices 600 and the dielectric material 662, as shown in FIG. 24. The core material 668 may be any appropriate material, such as polymer compounds, including but not limited to epoxy resins. The core material 668 may then be cured or harden, while adheres the microelectronic devices 600 to one another. As shown in FIG. 25, the microelectronic devices 600, the core material 668, and the dielectric material 662 may be removed from the alignment plate 650, thereby forming a BBUL core 670 that may then be used to form a BBUL package, as will be understood to those skilled in the art.

Figure 26:
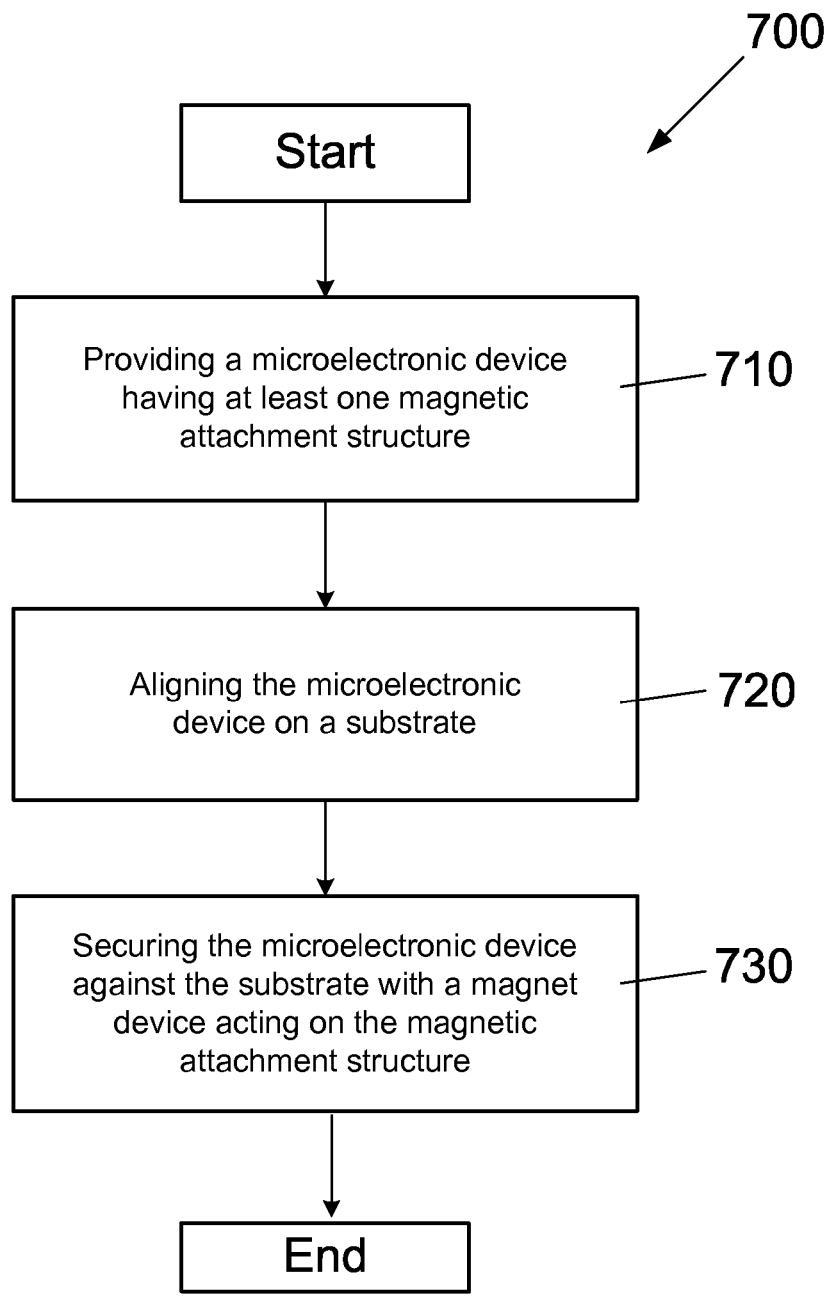
FIG. 26 is a flow diagram of a process of forming a bumpless build-up layer package with a magnetic attachment structure.

An embodiment of a process of the present description is illustrated in the flow diagram 700 of FIG. 26. As defined in block 710 of FIG. 26, a microelectronic device may be provided having at least one the magnetic attachment structure. The microelectronic device may be aligned on a substrate, as defined in block 720 of FIG. 26. As defined in block 730 of FIG. 26, the microelectronic device may be secured against the substrate with a magnet device acting on the magnetic attachment structure.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A method of fabricating a microelectronic package, comprising:
   providing a microelectronic device having at least one magnetic attachment structure attached thereto comprising a conductive material having device end adjacent the microelectronic device and a projection end opposing the conductive material device end, and a magnetic material adjacent the conductive material projection end;
   aligning the microelectronic device on a substrate such that the magnetic material of the at least one magnetic attachment structure abuts the substrate; and
   securing the microelectronic device against the substrate with a magnet device acting on the magnetic attachment structure.

2. The method of claim 1, wherein providing the microelectronic device comprises providing a microelectronic device having at least one magnetic attachment structure comprising the conductive material and the magnetic material comprising iron, cobalt, nickel, or alloys thereof.

3. The method of claim 1, wherein providing the microelectronic device comprises providing a microelectronic device having at least one magnetic attachment structure comprising the conductive material comprising copper or alloys thereof and the magnetic material.

4. The method of claim 1, wherein aligning the microelectronic device comprises aligning the microelectronic device on the substrate with the magnetic device.

5. A method of fabricating a microelectronic package, comprising:
providing a microelectronic device having at least one magnetic attachment structure attached thereto comprising a conductive material having device end adjacent the microelectronic device and a projection end opposing the conductive material device end, and a magnetic material adjacent the conductive material projection end;
aligning the at least one magnetic attachment structure to at least one bond pad on a substrate such that the magnetic material of the at least one magnetic attachment structure abuts the at least one substrate bond pad;
securing the at least one magnetic attachment structure to the at least one substrate bond pad with a magnet device acting on the magnetic attachment structure; and
attaching the at least one magnetic attachment structure to the at least one substrate bond pad.

6. The method of claim 5, wherein providing the microelectronic device comprises providing a microelectronic device having at least one magnetic attachment structure comprising the conductive material and the magnetic material comprising iron, cobalt, nickel, or alloys thereof.

7. The method of claim 5, wherein providing the microelectronic device comprises providing a microelectronic device having at least one magnetic attachment structure comprising the conductive material comprising copper or alloys thereof and the magnetic material.

8. The method of claim 5, wherein providing the microelectronic device comprises providing a microelectronic device having at least one magnetic attachment structure comprising a conductive material, a magnetic material, and a solder cap.

9. The method of claim 5, wherein aligning the microelectronic device comprises aligning the microelectronic device on the substrate with the magnetic device.

10. The method of claim 5, wherein attaching the at least one magnetic attachment structure to the at least one substrate bond pad comprises thermo-compression bonding the at least one magnetic attachment structure to the at least one substrate bond pad.

11. The method of claim 5, further comprising disposing an underfill material between the microelectronic device and the substrate.

12. The method of claim 11, further comprising curing the underfill material while the magnet device is acting on the magnetic attachment structure.

13. A method of fabricating a microelectronic package, comprising:
providing a microelectronic device having at least one magnetic attachment structure attached to the microelectronic device, wherein the at least one magnetic attachment structure comprises a conductive material having device end adjacent the microelectronic device and a projection end opposing the conductive material device end, and a magnetic material adjacent the conductive material projection end, and at least one attachment structure attached to the microelectronic device;
providing a substrate having at least one bond pad and at least one solder interconnect bump;
reflowing the at least one solder interconnect bump;
aligning the at least one magnetic attachment structure to the at least one bond pad on a substrate such that the magnetic material of the at least one magnetic attachment structure abuts the at least one substrate bond pad, and the at least one attachment structure to the at least one solder interconnect bump;
securing the at least one magnetic attachment structure to the at least one substrate bond pad with a magnet device acting on the magnetic attachment structure; and
cooling the solder interconnect bump to form an attachment between the at least one attachment structure to the at least one solder interconnect bump.

14. The method of claim 13, wherein providing the microelectronic device comprises providing a microelectronic device having at least one magnetic attachment structure comprising the conductive material and the magnetic material comprising iron, cobalt, nickel, or alloys thereof.

15. The method of claim 13, wherein providing the microelectronic device comprises providing a microelectronic device having at least one magnetic attachment structure comprising the conductive material comprising copper or alloys thereof and the magnetic material.

16. The method of claim 13, wherein aligning the microelectronic device comprises aligning the microelectronic device on the substrate with the magnetic device.

17. The method of claim 13, wherein attaching the at least one magnetic attachment structure to the at least one substrate bond pad comprises thermo-compression bonding the at least one magnetic attachment structure to the at least one substrate bond pad.

18. The method of claim 13, further comprising disposing an underfill material between the microelectronic device and the substrate.

19. The method of claim 18, further comprising curing the underfill material while the magnet device is acting on the magnetic attachment structure.

20. A method of fabricating a microelectronic package, comprising:
providing a plurality microelectronic devices each having at least one magnetic attachment structure attached thereto comprising a conductive material having device end adjacent the microelectronic device and a projection end opposing the conductive material device end, and a magnetic material adjacent the conductive material projection end;
aligning the plurality of microelectronic devices on a substrate such that the magnetic material of the at least one magnetic attachment structure abuts the substrate;
securing the at least one magnetic attachment structure to the at least one substrate bond pad with a magnet device acting on the magnetic attachment structure; and
depositing a core material between the plurality of microelectronic devices to adhere the plurality of microelectronic devices to one another.

21. The method of claim 20, wherein providing the microelectronic device comprises providing a microelectronic device having at least one magnetic attachment structure comprising the conductive material and the magnetic material comprising iron, cobalt, nickel, or alloys thereof.

22. The method of claim 20, wherein providing the microelectronic device comprises providing a microelectronic device having at least one magnetic attachment structure comprising the conductive material comprising copper or alloys thereof and the magnetic material.

23. The method of claim 20, wherein aligning the microelectronic device comprises aligning the microelectronic device on the substrate with the magnetic device.

* * * * *